United States Patent [19]

Drapac

[11] 4,260,963
[45] Apr. 7, 1981

[54] 4:1 BALUN

[75] Inventor: Michael J. Drapac, Cedar Rapids, Iowa

[73] Assignee: Rockwell International Corporation, El Segundo, Calif.

[21] Appl. No.: 86,205

[22] Filed: Oct. 18, 1979

[51] Int. Cl.³ .............................................. H01P 5/10
[52] U.S. Cl. ...................................... 333/26; 333/238
[58] Field of Search ......................... 333/25, 26, 236; 174/117 F, 117 FF, 117 PC

[56] References Cited

U.S. PATENT DOCUMENTS

| | | | |
|---|---|---|---|
| 3,428,886 | 2/1969 | Kawashima et al. | 333/26 X |
| 3,523,260 | 8/1970 | Gunshinan et al. | 333/26 |
| 3,678,418 | 7/1972 | Woodward | 333/26 |

OTHER PUBLICATIONS

Sanders Assoc. advertisement, *Flexible Printed Wiring*, etc., Electronics Engineering Edition, Mar. 14, 1958, p. 20.
Krauss et al., *Designing Toroidal Transformers to Optimize Wideband Performance*, Electronics, Aug. 16, 1973.
Transmission Lines, The American Radio Relay League, 1961, pp. 334, 335 of "The Radio Amateur's Handbook".

*Primary Examiner*—Paul L. Gensler
*Attorney, Agent, or Firm*—Richard K. Robinson; Howard R. Greenberg; H. Fredrick Hamann

[57] ABSTRACT

A balun is constructed by rolling a strip of flexible dielectric into a loop which has conductive strips on each face.

8 Claims, 5 Drawing Figures

4:1 BALUN

BACKGROUND OF THE INVENTION

This invention relates to 4:1 baluns.

The construction of 4:1 baluns using coaxial cable or twisted pair transmission lines is known in the art, and is illustrated on page 344 of "The Radio Amateur's Handbook", published by *The American Radio Relay League* in 1961, which details practical considerations and design techniques for baluns using coaxial cable and twisted pair lines.

One application in which baluns are used is impedance matching of broadband circuits for transmitters and receivers that operate in frequencies up to the megahertz range. For the design application, reference can be made to an article entitled "Designing Toroidal Transformers to Optimize Wideband Performance" by Herbert L. Krauss and Charles W. Allen, published in *Electronics*, Aug. 16, 1973, pp. 113-116. In the article, there is disclosed the use of toroids and twisted pairs for designing transformers which have impedance ratios of 4:1.

A prior art balun is shown in FIGS. 1a and 1b. In FIG. 1a, there are two conductors which may be coaxial wires or twisted pairs 1 and 2. Conductor 1 has an A terminal on one end and an A1 terminal on the other end, and conductor 2 has a terminal B on one end and terminal B1 on the other end. In FIG. 1b, the conductors 1 and 2 are arranged in a balun configuration which is terminal B being joined to terminal A1 and terminal B1 being connected to the reference plane 3. An input signal is applied across terminal A and the reference plane, and the output signal is removed from terminal A1 and the reference plane. The impedance of the balun of FIG. 1b is the characteristic impedance $Z_o$ of the twisted pair wire or coaxial cable used.

SUMMARY OF THE INVENTION

A balun is constructed by rolling a strip of flexible dielectric into a loop which has conductive strips on each face.

Any impedance level transformer can be realized simply by changing the conductor width to control the characteristic impedance of the conductive strips. The disclosed balun has low inductance input and output impedances and can be mounted directly on printed circuit boards by connecting the printed circuits to the printed conductive strips. The cross connection of the conductive strips used to form the balun can be made essentially with zero added series impedances. Ferrite can be used to extend the low frequency operating bandwidth even with low impedance conductive strips. Manufacturing tolerance problems can be eliminated due to the highly accurate photo-etch processes used to manufacture the conductive strips. The transformer ratios and operating bandwidths can be extended using the techniques disclosed herein and the circuitry readily lends itself to the construction of very compact printed circuits such as power amplifiers.

BRIEF DESCRIPTION OF THE DRAWINGS

The invention is illustrated in the accompanying drawings wherein.

DETAILED DESCRIPTION OF THE PREFERRED EMBODIMENT

Figure 2A:
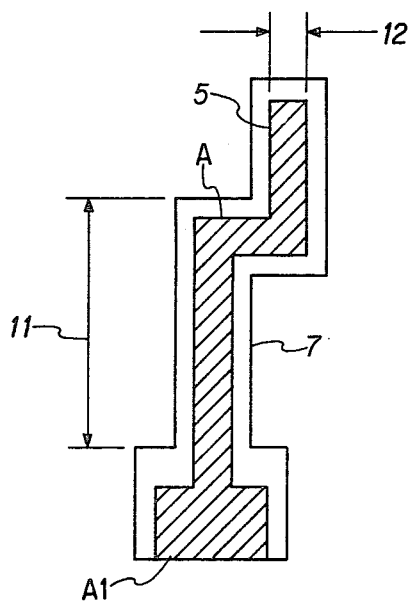
FIG. 2a is one face of a balun according to the invention.
Figure 2B:
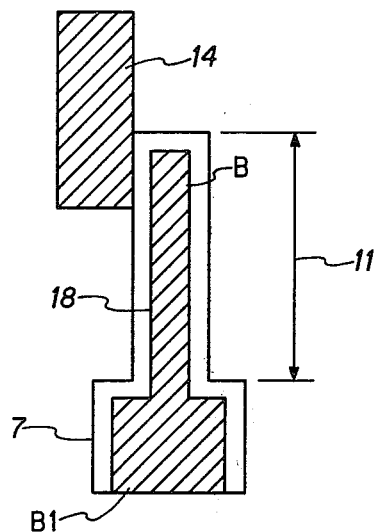
FIG. 2b is the second face of the balun according to the invention.

FIGS. 2a and 2b show the layout of a flexible printed circuit board which may be used in the fabrication of the balun according to the invention. On FIG. 2a one face of the flexible circuit board is shown and includes a flexible dielectric 7, that has a conductor 5 deposited or bonded on it. On one end of the conductor, there is a terminal A1 and on the other end there is the terminal A. The length L of the conductor is represented by dimension lines 11 and is used to determine the upper cutoff frequency of the balun, whereas the width W is represented by the dimension lines 12, and is used in conjunction with the electrical characteristics of the conductor 5 to determine the characteristic impedance Z of the balun. $Z_o = 377(T/W)(1/E_r)^{\frac{1}{2}}$ where T is the thickness between conductors and $E_r$ is the dielectric constant.

Figure 1A:
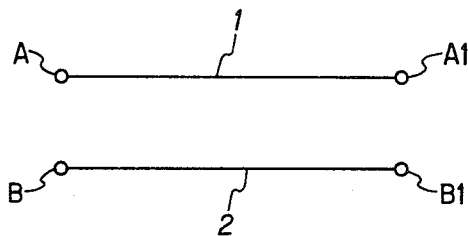
FIGS. 1a and 1b are simplified diagrams of the prior art balun technology.
Figure 1B:
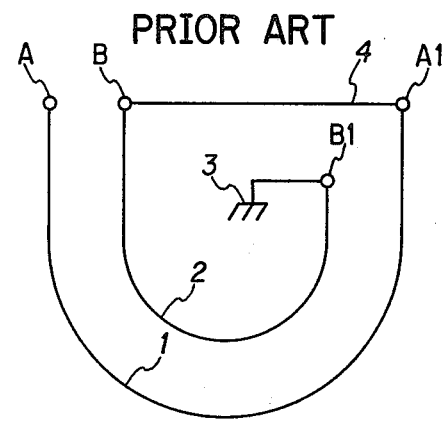

The other side of the flexible dielectric 7 as shown in FIG. 2b has a terminal B and B1 at opposite ends of the conductor 18. Again, the basic length of the conductor is indicated by dimension lines 11. The large conductor section 14 is used to shield the conductive strip 5 of FIG. 2a and is shown with the conductor covering the entire width of the dielectric 7. It should be noted as shown in FIG. 1, that B1 is normally connected to a reference potential or ground and that in practical engineering applications, the area of material is larger than that shown for terminal A1. The reason for this, of course, is to facilitate shielding and good grounding techniques.

Figure 3:
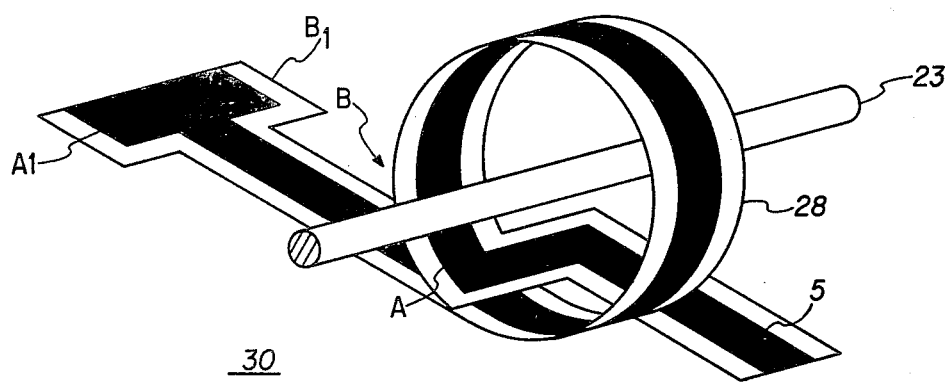
FIG. 3 is a simplified diagram of a balun according to the invention.

FIG. 3 shows the flexible dielectric 7 and conductive strips 5 and 18 of FIGS. 2a and b rolled into the shape of a loop 28, with the overall combination comprising a balun 30. Terminal A1 is the low impedance terminal of the balun. The opposite side, terminal B1, is in operation connected to the reference potential or ground. The junction between terminal A1 and B is the electrical contact made between the conductive strip 18, on one face of the flexible strip, and the conductive strip 5 on the other side of the flexible strip 7, when the flexible strip is rolled into a loop. High impedance terminal A is provided at conductive strip 5.

There is shown the optional ferrite segment 23 passing through the center of the formed balun. The ferrite segment 23, which may be a ferrite toroid or rod, is used to extend the low frequency bandwidth and, given the fact that the impedance of the circuit is determined by the width of the conductive strips 5 and 18, then it can be seen that low frequency bandwidth can be achieved even with incredibly low impedances in the conductive strips.

In summary, the use of the balun described herein facilitates the manufacture of any impedance level transformer which can be realized by changing the width of the conductive strips 5 and 18 to control the characteristic impedance of the balun. It is also obvious from the design of the balun that it lends itself readily to mounting on printed circuit boards allowing low inductance input and output impedance connections between the conductive strips and the printed circuit to be made directly on the printed circuit board. In addition, the cross connection of the conductive strips can be made with essentially zero impedance added in series.

It is well-known in the art that very close tolerances can be achieved with current photo-etch processes. The transformer ratio and operating bandwidth can be extended even further using the techniques described herein. The overall techniques result in applications which provide possibilities of building low cost and compact amplifiers using the disclosed balun.

Although the invention has been described and illustrated with a certain degree of particularity, it is understood that numerous changes in the arrangements and combinations of the parts may be resorted to without departing from the spirit and scope of the invention as hereinafter claimed.

I claim:

1. A balun comprising:
   a flexible dielectric having a shape to facilitate forming a loop;
   a first flexible conductor having a predetermined length L, an A terminal and an A1 terminal mounted to one surface of the flexible dielectric;
   a second flexible conductor of the predetermined length L, a B terminal on one end and a B1 terminal on the other end mounted on the opposite surface of the flexible dielectric; and
   the first conductor, the second conductor and the flexible dielectric being configured into a loop, and the A1 terminal of the first conductor being in electrical contact with the B terminal of the second conductor creating a balun thereby having a high impedance terminal at the A terminal and low impedance terminal at the B1 terminal.

2. The balun according to claim 1, further comprising:
   a shield for shielding the $A_1$ terminal.

3. The balun according to claim 1, further comprising:
   means for extending the cutoff frequency of the balun by placing a ferrite rod through the loop of the first conductor, second conductor and flexible dielectric.

4. The balun according to claim 1, further comprising:
   means for extending the cutoff frequency of the balun by interlooping a ferrite toroid with the first conductor, second conductor and flexible dielectric.

5. A method for constructing a balun comprising:
   shaping a flexible dielectric to facilitate forming a loop;
   applying a first flexible conductor having a predetermined length and an A terminal and an A1 terminal on the one side of the flexible dielectric;
   applying a second flexible conductor of the predetermined length L and a B terminal on one end and a B1 terminal on the other end on the other side of the flexible dielectric; and
   creating a balun by shaping the first conductor, the second conductor and the flexible dielectric into a loop, and the A1 terminal of the first conductor being in electrical contact with the B terminal of the second conductor.

6. The method of constructing a balun according to claim 5, further comprising:
   shielding the A1 terminal.

7. The method of constructing a balun according to claim 5, further comprising:
   extending the cutoff frequency of the balun by placing a ferrite rod through the loop of the first conductor, second conductor and flexible dielectric.

8. The method of constructing a balun according to claim 5, further comprising:
   extending the cutoff frequency of the balun by interlooping a ferrite toroid through the loop of the first conductor, second conductor and flexible dielectric.

* * * * *